United States Patent [19]

Henry

[11] 4,231,820

[45] Nov. 4, 1980

[54] METHOD OF MAKING A SILICON DIODE ARRAY TARGET

[75] Inventor: William N. Henry, Lancaster, Pa.

[73] Assignee: RCA Corporation, New York, N.Y.

[21] Appl. No.: 13,120

[22] Filed: Feb. 21, 1979

[51] Int. Cl.³ .......................................... H01L 21/225
[52] U.S. Cl. ..................................... 148/187; 148/1.5; 148/188
[58] Field of Search ........................ 148/187, 188, 1.5

[56] References Cited

U.S. PATENT DOCUMENTS

| | | | |
|---|---|---|---|
| 3,419,746 | 12/1968 | Crowell et al. | 315/10 |
| 3,548,233 | 12/1970 | Cave et al. | 313/65 |
| 3,615,449 | 10/1971 | Greenaway | 96/35 |
| 3,738,880 | 6/1973 | Laker | 156/17 |
| 4,074,304 | 2/1978 | Shiba | 148/187 X |
| 4,124,933 | 11/1978 | Nicholas | 29/578 |

Primary Examiner—G. Ozaki
Attorney, Agent, or Firm—Eugene M. Whitacre; Glenn H. Bruestle; Vincent J. Coughlin, Jr.

[57] ABSTRACT

A novel process is disclosed in which an insulating layer is formed on a N type semiconductor substrate and an array of apertures is formed through the insulating layer to expose the substrate. A film of substantially intrinsic polycrystalline silicon is deposited over the insulating layer and the exposed substrate surfaces. A masking layer having a plurality of interconnecting members is formed photolithographically on the film, the members defining an array of openings in substantial registration with the apertures. A P type doping element, such as boron, is diffused laterally into the intrinsic film beneath each masking member and is simultaneously diffused into the substrate to form a plurality of PN junctions. The lateral diffusion is controlled so that the undoped regions underlying each of the masking elements have a width less than the width of the masking elements. The masking layer is removed and the undoped regions are selectively etched to form an array of doped silicon pads that are separated by a relatively small spacing.

13 Claims, 7 Drawing Figures

METHOD OF MAKING A SILICON DIODE ARRAY TARGET

BACKGROUND OF THE INVENTION

1. Field of the Invention

This invention relates to a method of making a silicon diode array target for camera tubes and more particularly to a simplified technique of providing closely spaced conductor pads that contact the diodes for improved beam landing.

2. Description of the Prior Art

Among the types of targets that are used in vidicons are photodiode array targets such as are described in U.S. Pat. No. 3,548,233 to Cave et al, issued on Dec. 15, 1970. Generally, such targets include a semiconductor wafer with a bulk region of one conductivity type and have an array of discrete regions of another conductivity type on one of its major surfaces. The discrete regions form PN junctions with the bulk region of the wafer. The bulk region surface separating the discrete regions is covered completely with an insulating layer. A semiconductor pad covers and is in electrical contact with each discrete region. These pads increase the amount of landing area for the discrete regions and decrease the amount of exposed insulating area, to result in improved beam landing.

The current procedure for fabricating a silicon diode array target is to initially define the diode openings in an insulating area by using a non-contacting photolithographic process followed by a chemical vapor deposition of "P" doped polycrystalline silicon that is covered with a masking oxide to be used for conductor pad definition. The established procedure for defining the conductor pads is to use contact printing techniques with a redundant overlay alignment and etching cycle to obtain the close spacing separating conductor pads and also to reduce the number of defects in the pads. This requires two photoresist coatings and curing cycles, two alignment cycles, two developing and baking cycles, two etching and photoresist striping cycles, plus several additional chemical cleaning steps. These cycles are very costly in both labor and material. Moreover, each contact of the photomask with the photoresist is likely to cause defects such as scratches or adhering opaque foreign matter on the photomask. These defects in the photomask usually result in defective diodes in the finished target which are quite noticable in a displayed signal from the target. The accumulation of defects in a photomask also severely limits its useful lifetime, and the replacement of defective highdensity array masks is a significant cost factor in the production of silicon vidicon targets.

Projection photolithographic techniques have also been utilized to define the conductor pads as disclosed in U.S. Pat. No. 3,615,449 to Greenaway. However, the spacing between conductor pads cannot be obtained as finely with such projection techniques as with the contact printing and have generally not been utilized where maximum conductor pad area is desired.

SUMMARY OF THE INVENTION

An insulating layer having an array of apertures therein is provided on a semiconductor substrate of a first type conductivity. A film of substantially intrinsic polycrystalline silicon is deposited over the insulating layer and the exposed substrate in the apertures. A masking layer is formed on the film, the masking layer having a plurality of interconnecting members defining an array of openings in substantial register with the apertures, each of these members being formed photolithographically to have a predetermined width. A second type conductivity doping element is laterally diffused into a portion of the intrinsic film underneath each masking member so that the width of undoped intrinsic silicon is less than the predetermined width. Simultaneously, the doping element is driven through the intrinsic film to the substrate to form a PN junction therebetween. The masking layer is removed and the intrinsic film is selectively etched away to form an array of silicon pads.

DETAILED DESCRIPTION OF THE PREFERRED EMBODIMENT

The Structure Produced

Figure 6:
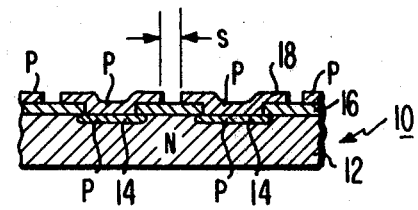
Figure 7:
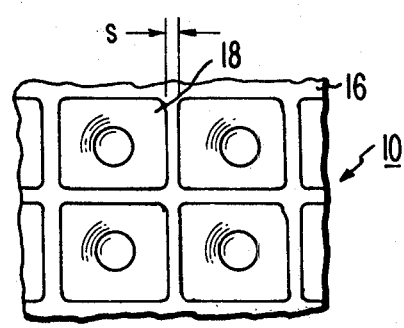
FIG. 7 is a fragmentary plan view of the diode-containing surface of FIG. 6.

FIGS. 6 and 7 illustrate a portion of a silicon diode array target 10 made by the present novel process. The target 10 includes a body 12 of semiconductor material such as monocrystalline N type silicon, P type silicon regions 14 in an array of dots in the substrate 12, an insulating layer 16 of silicon dioxide on the substrate 12 between the P type regions 14, and substantially square-shaped silicon conductor pads 18 on the P type regions 14 and overlapping the nearby insulating layer 16. Such a target for use in a vidicon type camera tube is substantially the same as the target shown in U.S. Pat. No. 3,548,233 to Cave et al, issued on Dec. 15, 1970, and herein incorporated by reference.

Fabrication Process

Figure 1:
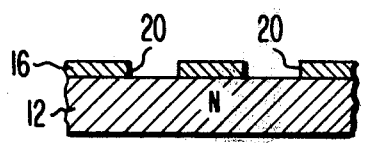
FIGS. 1 to 6 are partial cross-sections of a semiconductor substrate illustrating the steps of the present novel process.

FIG. 1 shows the cross-sectional configuration of the semiconductive body 12 at an early stage of fabrication formed by a conventionally used procedure. A silicon dioxide layer 16 about 1.4 microns thick is grown on one major surface. Using well known photoresist techniques, preferably projection photolithography, an array of substantially circular apertures 20 each having, for example, a diameter of about 3–5 microns and a center to center spacing of about 14 microns is etched through the insulating layer 16 to expose discrete areas of the surface of the body 12.

Figure 2:
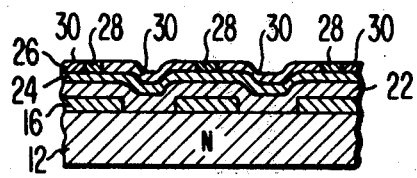

In accordance with the novel process, as shown in FIG. 2, a continuous film 22 of substantially intrinsic polycrystalline silicon is deposited over the insulating layer 16 into the apertures 20 and over the exposed surface of the body 12. This film 22 is preferably deposited by a thermal decomposition of silane (SiH$_4$) diluted with nitrogen, but may be formed by any suitable vapor deposition techniques. The thickness of the film 22 is preferably about 8000 A but may be in the range of 6,000 to 10,000 A.

The next step is to deposit a layer 24 of silicon dioxide, for example, to form a diffusion masking layer on the intrinsic polycrystalline film 22. This may be done by the thermal oxidation of the polysilicon film 22 or by conventional chemical vapor deposition techniques. A layer 26 of photoresist is next deposited over the silicon dioxide layer 24. The photoresist utilized in this step is of the positive type in which those portions that are exposed to radiation are subsequently chemically removed. By projection photolithographic techniques the photoresist is exposed to an image from a periodic array photomask to form a pattern of unexposed portions 28 and exposed portions 30 in the photoresist layer 26. The photoresist layer 26 is then developed and the exposed portions 30 are removed to form an array of openings in the photoresist layer 26 that correspond to the projected mask image, the openings exposing the silicon dioxide layer 24. The silicon dioxide portions exposed by the openings are etched away in a known manner leaving a masking layer 32 of silicon dioxide, as shown in FIG. 3 and exposing discrete regions of the intrinsic film 22.

The masking layer 32 comprises a grid-type mesh having a plurality of interconnecting members 34 that define an array of substantially square openings 36 that are in substantial register with the apertures 20. The interconnecting members 34 are formed to have a predetermined width, w, which is determined by the line width achievable by the projection photolithographic masking technique. Typical line widths obtained by the projection techniques are on the order of 3–4 microns so that with the apertures 20 spaced about 14 microns from center to center, the square openings are thereby formed on the order of 10–11 microns on a side.

Figure 3:
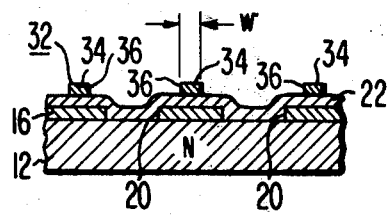
Figure 4:
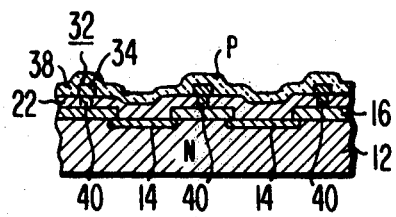

As illustrated in FIG. 4, the structure of FIG. 3 is then heated in the presence of a source of P type impurity such as boron in an oxidizing atmosphere to form a borosilicate glass coating 38 on the surface of the masking layer 32 and on the exposed surface of the intrinsic film 22. Other techniques such as ion implantation of a P type impurity, such as boron, on the masking layer 32 and on the exposed surface of the intrinsic film 22 may also be used to serve as a diffusion source. Thereafter the structure shown in FIG. 4 is heated at a specific temperature for a given period of time to laterally diffuse the boron into a portion of the intrinsic film 22 underlying an edge portion of each of the masking members 34 so that the width of the intrinsic film regions 40 that are not diffused with boron is less than the width of the masking members 34. Simultaneously, the boron is driven through the intrinsic film 22, doping it as it goes through, and into the body 12 to produce doped regions 14 as shown. The doped regions 14 within the semiconductor body 12 form a plurality of PN junctions with the body 12.

Figure 5:
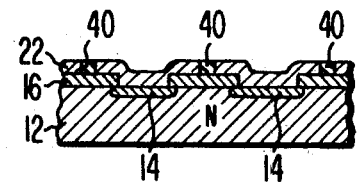

The borosilicate glass coating 38 and the masking layer 32 are then removed by etching in a suitable solvent as illustrated in FIG. 5. Next the intrinsic portions 40 that are not doped are removed by selectively etching. Suitable solvents in which intrinsic silicon and N doped silicon are soluble but in which P doped silicon is substantially insoluble are aqueous hydroxide solutions, potassium hydroxide propanol solutions and the like. These solvents and the etching process are described more fully in U.S. Pat. No. 3,738,880 to Laker, issued on June 12, 1973. Upon removal of the undoped intrinsic regions 40, an array of substantially square P doped silicon pads 18 are formed with a substantially narrow line width spacing, s, between each of the pads 18 as shown in FIGS. 6 and 7.

General Considerations

The silicon conductor pads 18 in a diode array used for camera tube targets are formed to overlap to some extent onto the silicon dioxide insulating area between the active diodes to provide as large a beam landing area as possible. Any area of the oxide that is exposed to the electron beam will charge disadvantageously to the cathode potential, typically 8 to 12 volts, and act as a coplanar grid, and thereby, restrict the beam landing. Thus, it is desirable to minimize the exposed oxide area.

Conductor pad area may be increased by narrowing the line width between the pads by the relatively costly contact printing methods described in the prior art section herein. Even though projection photolithographic techniques by themselves cannot reproduce desirable minimum line widths, such techniques are less expensive and are utilized in the present novel process to ultimately achieve line widths comparable to or less than those achieved with contact printing.

Typically, the minimum width of a line reproduceable by projection photolithography is on the order of 3–4 microns. By using this technique the width, w, of the interconnecting members 34 of the masking layer 32 can be formed to substantially the same width, i.e. 3–4 microns. By heating the semiconductive body with the borosilicate glass, doped with boron at a concentration of about $5 \times 10^{19}$ atoms/cm$^3$, to a temperature of about 1000° C. for 20 minutes preferably in an oxygen atmosphere, it has been determined that the PN junctions can be formed in the semiconductor body and that the lateral diffusion of boron leaves an undoped intrinsic region having a width of about 1.0 to 1.5 microns. Removal of the undoped regions then results in very narrow line widths without use of contact printing techniques.

Although the novel process has been described in the preferred embodiment of making silicon diode array targets, it should also be understood that the present process may also be utilized to make an array of doped silicon pads on a substrate that are separated by a relatively narrow spacing.

What is claimed is:

1. In a method of making a silicon diode array target of the type wherein an insulating layer is deposited on a semiconductor substrate of a first conductivity type and an array of apertures is formed through said layer exposing said substrate, wherein the improvement comprises the steps of:
   (a) depositing a film of substantially intrinsic polycrystalline silicon over said insulating layer and the exposed substrate in said openings;
   (b) forming photolithographically on said film a masking layer having a plurality of interconnecting members defining an array of openings in substantial register with said apertures and exposing said intrinsic film, each of said elements being formed to have a predetermined width;
   (c) diffusing through said openings a second conductivity type doping element laterally into a portion of said intrinsic film underlying an edge portion of each of said masking members, so that the width of the undoped intrinsic film underlying each of said masking members is less than the predetermined width;
   (d) simultaneously driving said doping element through the intrinsic film deposited in said opening into said substrate to form an array of PN junctions therein;
   (e) removing said masking layer; and
   (f) selectively etching away the undoped intrinsic film to form an array of doped polycrystalline silicon pads separated by the width of the removed undoped intrinsic film.

2. A method according to claim 1, wherein said masking layer is formed by:
(a) covering said film with a second insulating layer;
(b) covering said second film with a photoresist layer;
(c) exposing said photoresist layer to a projected image from a periodic array photomask;
(d) developing said photoresist to form in it an array of openings corresponding to the projected image; and
(e) etching away said second layer in said openings in said photoresist layer to expose discrete regions of said intrinsic film.

3. A method according to claim 2, wherein said exposure to said image forms exposed and unexposed portions of said photoresist layer and wherein the exposed portions are removed to form said array of openings in said photoresist, leaving a pattern of interconnecting unexposed portions of photoresist.

4. A method according to claim 2, wherein the apertures are formed substantially circularly each having a diameter of about 3-5 microns, said apertures being spaced about 14 microns from center to center, and wherein the masking members are formed into a grid-type mesh wherein the defined openings are substantially square, each of said masking members being formed to a width of about 3-4 microns.

5. A method according to claim 1, wherein the doping element is diffused laterally into said intrinsic film and simultaneously into said substrate by:
(a) first, providing a doping element onto the exposed surface of said intrinsic film, and
(b) then, heating said intrinsic film with said doping element to a predetermined temperature for a given period of time.

6. A method according to claim 5, wherein the doping element is provided by ion implantation of a P type impurity.

7. A method according to claim 5, wherein the doping element is provided by depositing a layer of material containing said doping element over said masking layer and said exposed surfaces of said intrinsic film.

8. A method according to claim 7, wherein said substrate with said layer of material is heated to laterally diffuse the intrinsic film so that the width of the undoped intrinsic film underlying each of the masking members is on the order of 1.0 to 1.5 microns.

9. A method according to claim 7, wherein said layer of material is a borosilicate glass containing boron as a P type doping element having a surface concentration of about $5 \times 10^{19}$ atoms/cm$^3$.

10. A method according to claim 9, wherein the undoped intrinsic film is etched by contacting the entire film with a solvent in which substantially intrinsic silicon is soluble but in which P doped silicon is substantially insoluble.

11. A method according to claim 9, wherein said substrate with said borosilicate glass is heated to a temperature of about 1000° C. for about 20 minutes.

12. A method according to claim 11, wherein said substrate with said borosilicate glass is heated in an oxygen atmosphere.

13. A method of forming a plurality of silicon pads separated by a fine line spacing, comprising the steps of:
(a) providing a layer of substantially intrinsic polycrystalline silicon on a substrate;
(b) providing on said silicon layer relatively wide-line masking regions that define a plurality of apertures that expose said silicon layer;
(c) diffusing a doping element into said silicon layer so that it spreads through the thickness of said silicon layer and laterally underneath a portion of each of said masking regions, leaving relatively fine-line regions of undoped silicon;
(d) removing said masking regions;
(e) selectively etching said silicon layer to remove the undoped portions leaving thereby a plurality of silicon pads separated by a relatively fine line spacing.

* * * * *